United States Patent
Keates et al.

(10) Patent No.: US 7,795,843 B2
(45) Date of Patent: Sep. 14, 2010

(54) SHORT CIRCUIT DETECTION FOR BATTERIES

(75) Inventors: Andrew W. Keates, Los Gatos, CA (US); Nobuhiro Otani, Chiba-ken (JP); Don J. Nguyen, Portland, OR (US); Naoki Matsumura, Tokyo (JP); Peter T. Li, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/966,657

(22) Filed: Dec. 28, 2007

(65) Prior Publication Data

US 2009/0167312 A1 Jul. 2, 2009

(51) Int. Cl.
  *H02J 7/00* (2006.01)
(52) U.S. Cl. .................. 320/134; 324/433; 324/434
(58) Field of Classification Search ............. 324/433, 324/434; 320/121, 134; 361/79
  See application file for complete search history.

(56) References Cited

U.S. PATENT DOCUMENTS

| | | | |
|---|---|---|---|
| 4,053,824 A * | 10/1977 | Dupuis et al. ............... 324/434 |
| 5,298,346 A | 3/1994 | Gyenes |
| 5,408,170 A | 4/1995 | Umetsu et al. |
| 5,451,880 A | 9/1995 | Yamagishi et al. |
| 5,493,199 A | 2/1996 | Koenck et al. |
| 5,534,765 A | 7/1996 | Kreisinger et al. |
| 5,583,871 A | 12/1996 | Simmonds et al. |
| 5,652,502 A | 7/1997 | Van Phuoc et al. |
| 5,726,554 A | 3/1998 | Freiman et al. |
| 5,767,659 A | 6/1998 | Farley |
| 6,100,670 A | 8/2000 | Levesque |
| 2002/0109506 A1 * | 8/2002 | Kawakami et al. .......... 324/522 |
| 2003/0105601 A1 | 6/2003 | Kobayashi et al. |
| 2004/0207405 A1 | 10/2004 | Yang |
| 2005/0017686 A1 | 1/2005 | Sakakibara et al. |
| 2005/0046389 A1 | 3/2005 | Kim |
| 2005/0200332 A1 | 9/2005 | Kangas et al. |
| 2007/0052424 A1 * | 3/2007 | Okumura .................... 324/432 |
| 2007/0194751 A1 | 8/2007 | Odaohhara |

(Continued)

OTHER PUBLICATIONS

"42P25316 FOA Mailed Oct. 31, 2008 for U.S. Appl. No. 11/906,006," (May 6, 2009), Whole document.

(Continued)

*Primary Examiner*—Edward Tso
*Assistant Examiner*—Aaron Piggush
(74) *Attorney, Agent, or Firm*—Blakely, Sokoloff, Taylor & Zafman LLP

(57) ABSTRACT

A method and apparatus for short circuit detection for batteries. Some embodiments of a method include receiving a battery pack in a system, where the battery pack is rechargeable and includes multiple battery cell blocks, each cell block including one or more battery cells. The voltages of the plurality of cell blocks are monitored. Upon shutting down the system, the voltages of the plurality of cell blocks are logged to generate a set of logged voltage values. Upon restarting the system, the current voltage values of the cell blocks are measured. A determination whether any of the battery cells of the battery pack has developed a short circuit is made based at least in part on a comparison of the current voltage values with the set of the logged voltage values.

13 Claims, 4 Drawing Sheets

U.S. PATENT DOCUMENTS

2008/0048617 A1* 2/2008 Yoshida ............... 320/132
2008/0238357 A1 10/2008 Bourilkov et al.

OTHER PUBLICATIONS

Non-Final Office Action for U.S. Appl. No. 11/906,006, Mailed Sep. 30, 2009, 11 pages.

Non-Final Office Action for U.S. Appl. No. 12/059,967, Mailed Oct. 06, 2009, 9 pages.

"Intel—Common Building Block (CBB) Battery Pack for Notebooks", *Design Guide, Revision 1.1*, (Apr. 2007), Whole Document.

USPTO, 42P23516 OA mailed Oct. 31, 2008 for U.S. Appl. No. 11/906,006, Whole document.

* cited by examiner

SHORT CIRCUIT DETECTION FOR BATTERIES

FIELD

Embodiments of the invention relate to rechargeable storage batteries. More particularly, embodiments of the invention relate to an apparatus and method for detecting short circuits in rechargeable storage batteries.

BACKGROUND

Rechargeable batteries are used in many electronic devices, including very common usage in laptop and notebook computers and similar mobile computing devices. The batteries may include lithium ion (Li-ion) and other battery technologies. However, defects in the batteries can create harmful or dangerous conditions if the defects are not detected.

Among the possible defects are short circuits (commonly referred to as shorts) inside the batteries, including short circuits within Li-ion battery cells. A short circuit conducts current inside the battery cell, causing local heating and, under certain circumstances, thermal runaway. A subset of these shorts may exist as so-called "soft shorts" prior to the short circuits becoming severe enough to produce thermal runaway conditions.

When a battery pack is charged, the cell blocks (where each cell block may contain one or more battery cells) of the battery pack are commonly charged in a manner intended to equalize the charge in the cell blocks and thus generate the greatest electrical capacity for each cell block. In such a process, certain cell blocks may be provided with additional charge if such cell blocks are found to be low in charge in comparison with the other cell blocks in the battery pack. A battery management unit may bleed current around a cell block that has reached its fully charged state (the termination voltage) faster than other blocks, or may actively pump charge from one cell block to another, in order to balance the stored charge in each cell.

However, it is possible that a cell block that requires more charge in order to reach full charge may have a higher self-discharge rate due to the presence of a developing internal short in one or more battery cells of the cell block. Such a battery cell may be referred as a "weak" cell. Providing more charge to such weak cells to equalize charge does not take account of the possibility of a nascent short being the cause of the low charge state, and a battery management unit may thus risk the onset of potentially dangerous developments. For example, an internal short may discharge a battery cell below its discharge cutoff, thereby precipitating further issues, such as copper dissolution, that may further compromise the safety and reliability of the cell. Continuing to charge or discharge such a weak cell may cause a benign short to become a dangerous one.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
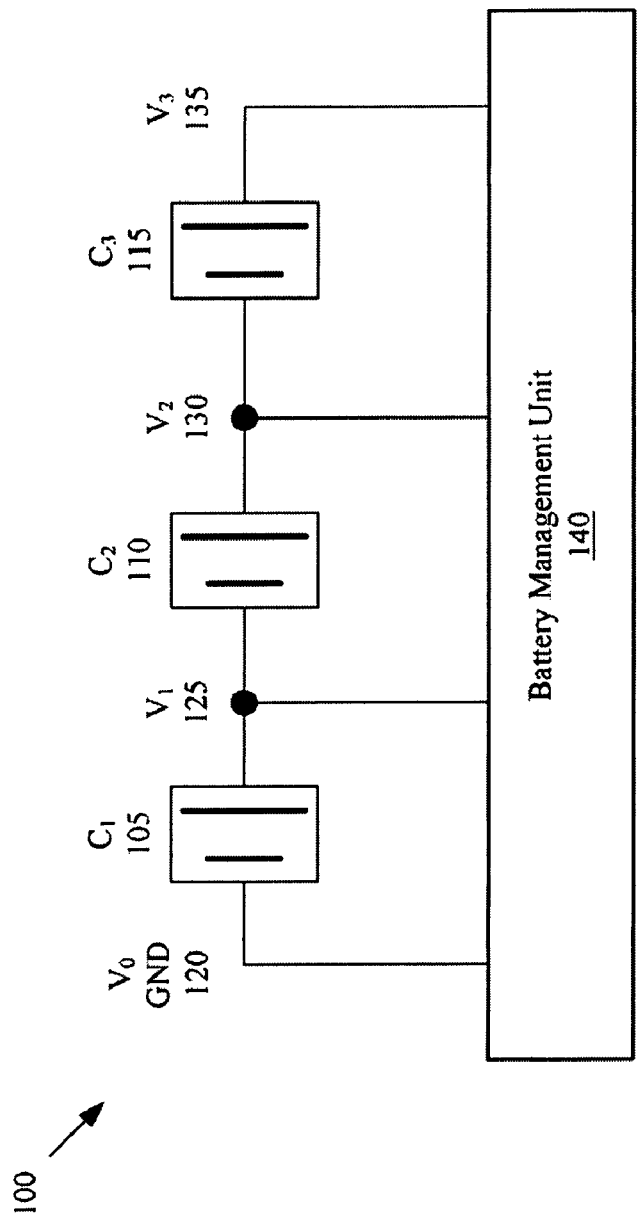
FIG. 1 is an illustration of a battery management unit to monitor the voltage of each cell block of a battery pack.

An embodiment of the invention concerns short circuit detection for batteries.

As used herein:

"Battery" means any device that generates electrical potential through a chemical reaction. In particular, a battery includes a rechargeable battery that may be restored to operation by a charging operation. Batteries may include, but are not limited to, nickel cadmium (NiCad), lithium ion (Li-ion), and other rechargeable batteries.

"Mobile computing device" means any personal computer or similar computing device that provides mobile operation and that includes a rechargeable battery power source. The term mobile computing device may include, but is not limited to, a notebook or laptop computer, handheld computer, tablet PC, ultra-mobile personal computer (UMPC), mobile Internet device (MID), smartphone, personal digital assistant (PDA), or other similar device.

"Battery pack" means a package of one or more battery cells. Battery packs are commonly used in operation of many electronic devices, include mobile computing devices. The battery cells may commonly be in the form of cell blocks, where each cell block contains one or more battery cells.

"Battery control unit" means a unit to control certain operations of a battery. A battery pack may include a battery control unit. A battery control unit may also be referred to herein as a "battery management unit". A battery management unit may include a unit to measure a voltage for each cell block of a battery pack.

In some embodiments, a battery management unit is provided for a battery pack. In an embodiment, the battery management unit is utilized in a system to detect if short circuits in battery cells have developed. In an embodiment, the battery management unit logs voltages of battery cell blocks prior to shutting down a system or device for use in comparing the voltages of the battery cell blocks upon restart of the system or device. In an embodiment, the battery management system utilizes the monitored battery cell block voltages to detect cell discharge conditions that are indicative of a short circuit in a battery cell.

In general, a battery pack consists of one or more battery cell blocks, with each cell block containing one or more battery cells. A battery pack may further include or be coupled with a battery control unit to control certain battery management operations. A battery control unit may also be referred to herein as a battery management unit (BMU). In an embodiment, a system utilizes the battery management unit to monitor voltages of each cell block of a battery pack for purposes of detecting short circuits that may be developing in one or more battery cells.

In an embodiment, a short circuit monitoring operation includes logging the voltages of each battery cell block of a battery pack prior to shutting down a system that is powered by the battery pack. For the purposes of this application, shutting down a system includes powering the system down, logging off the system, putting the system in a low power state, or otherwise transferring the system from a normal operational state to another state. In an embodiment, the voltages of the battery cell blocks are then examined when the system is restarted. For the purposes of this application, restarting a system includes powering a system up, logging into a system, transitioning a system from a low power state to a normal power state, or otherwise transferring the system into a normal operational state. The examination of the voltages may include comparing the voltages that are present after system is restarted to the logged voltages of the battery cell blocks that existed prior to shutting down the system, or comparing such voltages to a threshold voltage for a battery cell.

In some embodiments, a system may detect a short circuit in one or more battery cells of a battery pack based at least in part on a determination that one or more cell blocks of the battery pack have dropped in voltage in a manner that is indicative of a short circuit, and the system may then take protective action. For example, if a particular cell block of a battery pack drops in voltage more quickly than the other cell blocks of the battery pack during a period when the system is shut down, this may indicate a more rapid discharge caused by a short circuit developing in the one or more battery cells of the cell block. Further, if the voltage of one more cell blocks drops to a very low voltage, such as below a certain threshold for the battery cells, this may also be indicative of a developing short circuit.

In some embodiments, the protective action taken by a system to respond to a detected short may vary depending on the system and on severity of the problem. Continued charging and discharging of a weak battery cell may worsen the short circuit in the battery cell, and thus action may be needed to warn of the issue or to prevent the use of the battery pack. For example, a battery management unit may provide a notification to the system containing the battery pack that a battery short has developed in a battery cell. In another example, the operation of a battery pack may be shut down to avoid the potential hazard caused by the short condition. Other preventive actions may be taken in other embodiments.

Thus, in some embodiments, a system is provided to detect short circuits in battery packs through the monitoring of the voltages of the battery cell blocks, and to take action to address the short circuit condition in order to guard against hazards that may develop.

FIG. 1 is an illustration of a battery management unit to monitor the voltage of each cell block of a battery pack. In this illustration, a battery pack 100 includes multiple cell blocks, which are illustrated in this figure as three cell blocks, $C_1$ 105, $C_2$ 110, and $C_3$ 115. Each cell block may contain one or more battery cells. The battery pack 100 may power a system or device. A battery management unit 140 monitors the voltages of the cell blocks, which, assuming a ground voltage potential $V_0$ 120 at a first node of $C_1$ 105, are illustrated as $V_1$ 125 at a node between $C_1$ 105 and $C_2$ 110, $V_2$ 130 at a node between $C_2$ 110 and $C_3$ 115, and $V_3$ 135 at a second node of $C_3$ 115. Each such node is coupled with the battery management unit 140. The monitored voltages may then be utilized to determine if a short circuit develops in any of the cells of the battery pack 100.

In order to avoid the onset of potential safety issues caused by nascent shorts in the cells, the battery management unit 140 monitors the behaviors of the cell blocks 105-115 and logs the voltages of each of the cell blocks on shutdown, generating a set of logged voltage values. At system restart, if one cell block is found to have discharged independently from the other cell blocks at a rate that is inconsistent with cell aging, that cell block is deemed to contain a cell with an internal short, and the pack shall be shut down, or caused to issue a warning to the host device.

If any cell block is found to have discharged significantly below the low-voltage cutoff level, the block shall be deemed by the battery management unit to contain a battery cell with an internal short, and the battery pack shall be shut down, or the battery management unit will issue a warning to the host system.

By so detecting the presence of battery cell self-discharge, the battery management unit can address some causes of cell safety issues caused by over-discharge of battery cells (causing dissolution of the copper anode current collector, later causing copper plating and dendrite shorts) and by nascent shorts (foreign particles, dendrites, or other contaminants causing shorts that could lead to thermal runaway).

Figure 2:
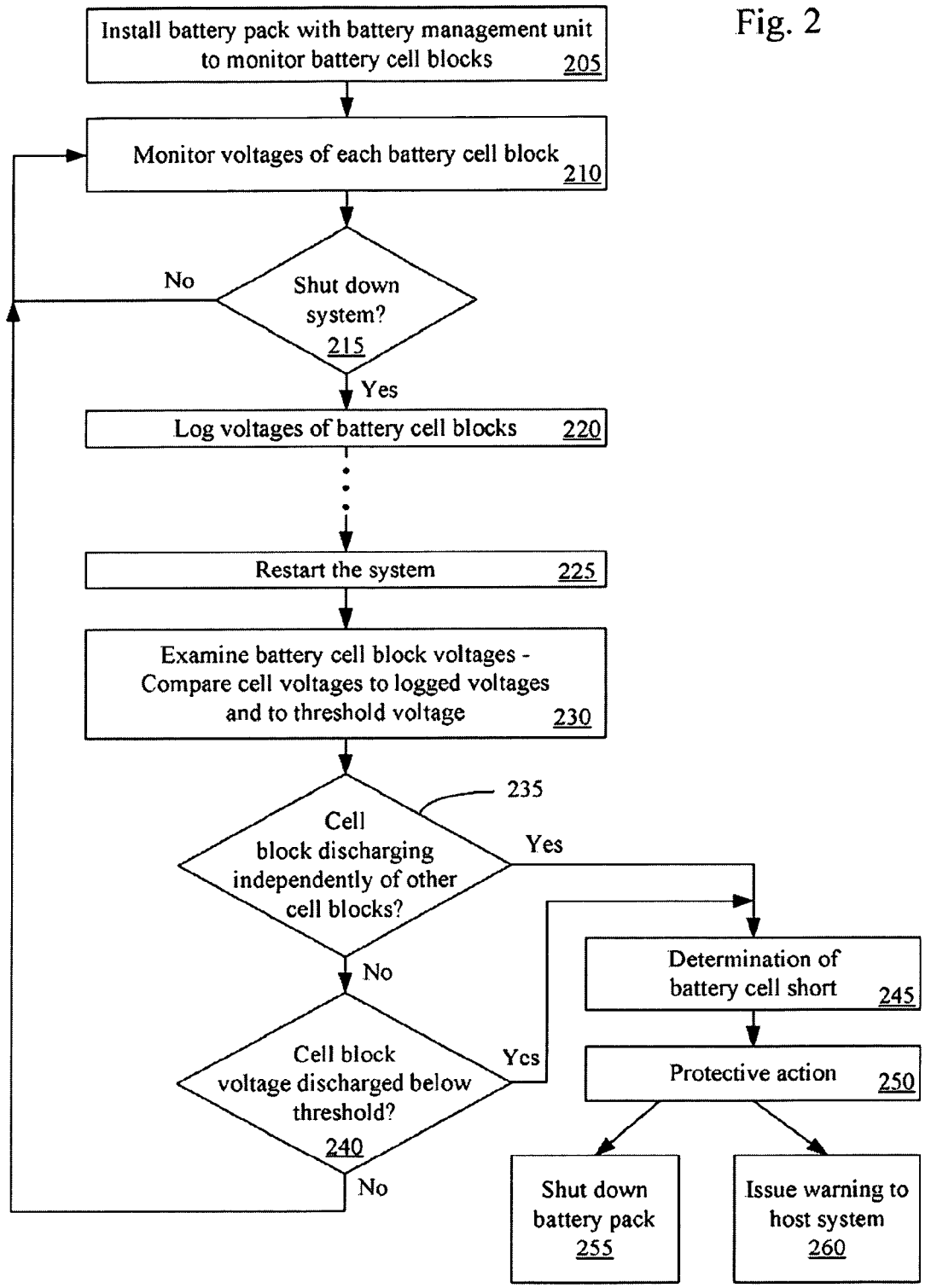
FIG. 2 is a flowchart to illustrate a process of monitoring for shorts in battery cells.

FIG. 2 is a flowchart to illustrate a process of monitoring for shorts in battery cells. In this illustration, a battery pack with a battery management unit to monitor the battery cell blocks is installed in a system or device 205. The system or device may be any type of electronic system or device, including, but not limited to, a laptop computer or other mobile computing system. Using the battery management unit, the voltage of each battery cell block is monitored 210. If the system is to be shut down 215, then the voltage of each battery cell block is logged for comparison 220. When the system is restarted 225 the battery cell block voltages are examined 230. The examination of the battery cell block voltages may include comparing the battery cell block voltages to the voltages that were logged prior to system shot down, and to comparing such voltages to a voltage threshold for the battery cells.

If the examination of the battery cell block voltages indicates that a cell block is discharging independently of the other cell blocks 235, such as in a manner that is inconsistent with normal aging of battery cells, then determination may be made that there is a short circuit developing in one or more battery cell of the cell block 245. A determination of a short circuit may also be made if a battery cell block voltage has dropped to a very low level below a threshold for the battery cells 240. Upon determination that a short circuit has developed in one or more battery cells, the battery management unit is to take protective action 250, the protective action intended to limit the hazard posed by the defective battery cells. The protective action may include, but is not limited to, shutting down the battery pack 255 to prevent any further charging of the defective battery cells, or providing a notice to the host system 260, thereby allowing the host system to take such action as is necessary to address the battery defect.

Figure 3:
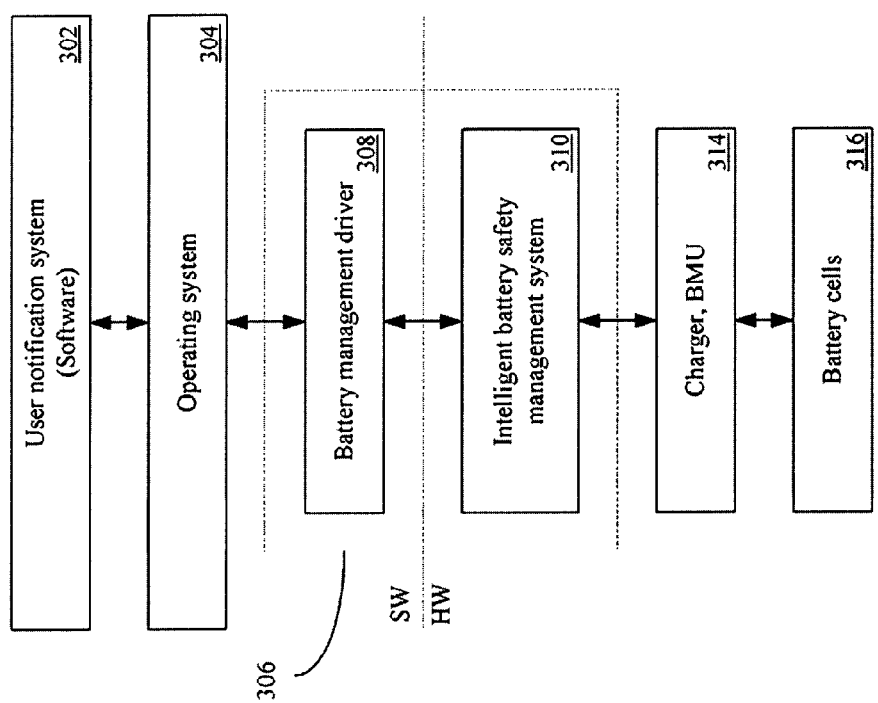
FIG. 3 is an illustration of an embodiment of battery management processes that may include monitoring for shorts in battery cells.

FIG. 3 is an illustration of an embodiment of battery management processes that may include monitoring for shorts in battery cells. In this illustration, an embodiment of a battery system 306 for a device is provided, where the battery system 306 includes an intelligent battery safety management system 310 that communicates with a battery charger, battery management unit, or both 314.

In an embodiment, the battery management unit monitors the voltages of the battery cell blocks of a battery in order to detect the development of short circuits in battery cells. In some embodiments, the battery safety management system may utilize a battery management driver 308 for the device to collect data regarding the operation of battery cells 316.

The battery management driver 308 may communicate through an operating system 304 for the device to address the determinations regarding the attached battery pack. The operating system 304 may, for example, provide for operation of a user notification system 302, which may represent software that will inform the user regarding the battery issues that have occurred, such as the existence of a short in a battery cell in the attached battery pack.

Figure 4:
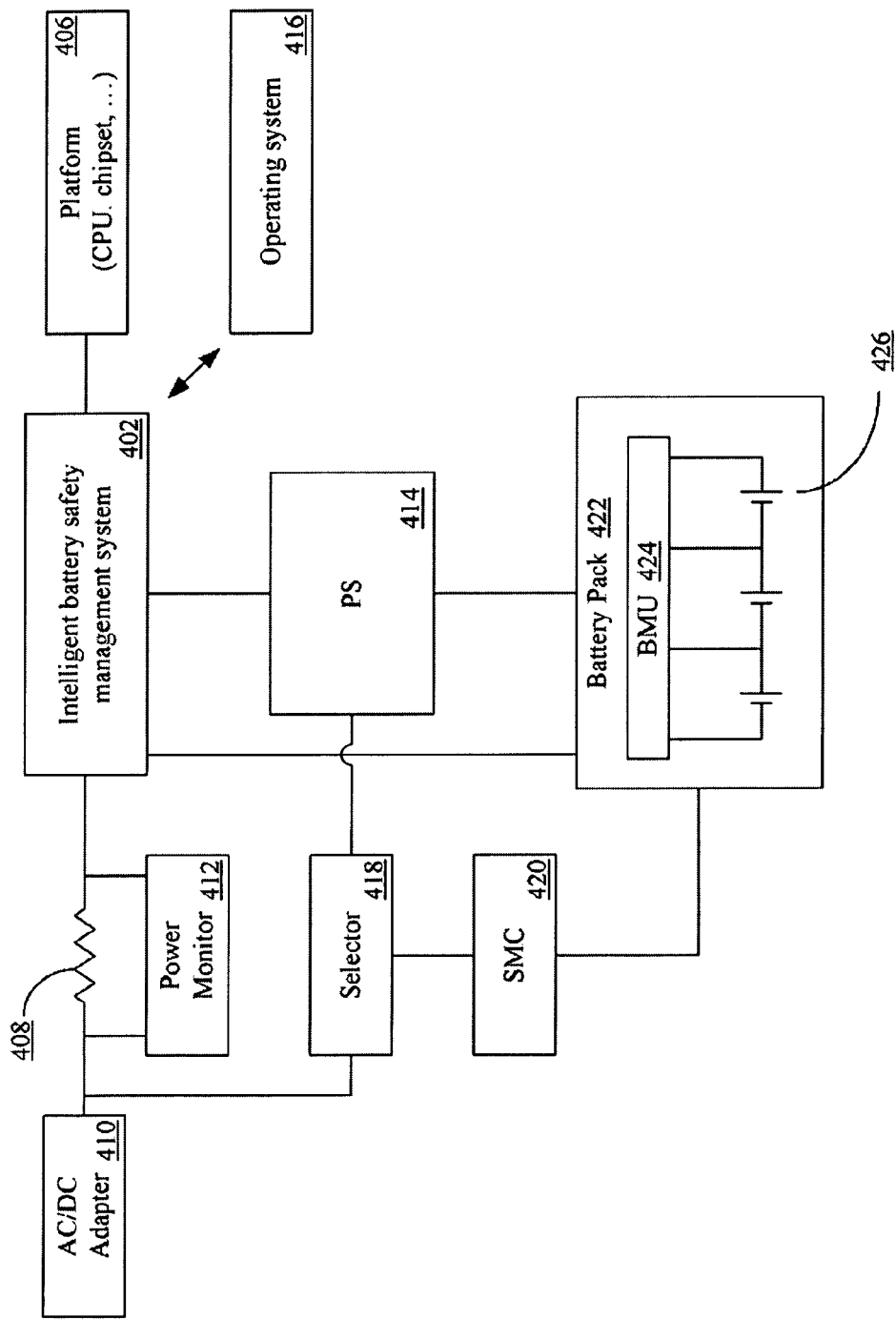
FIG. 4 provides a schematic diagram of an embodiment of an intelligent battery management system.

FIG. 4 provides a schematic diagram of an embodiment of an intelligent battery management system. In this illustration, an AC/DC adapter 410 may provide power for battery charging, such as the charging of a battery pack 422. The battery pack may include a battery management unit 424 and multiple battery cell blocks 426. In an embodiment, the battery management unit 424 monitors the voltages of the battery cell blocks of a battery in order to detect the development of short circuits in battery cells.

A power monitor 412 may monitor power, shown as monitoring power across a system resistance 408. The power output of the adapter 410 is also connected to a selector 418 to select operation of a power switch (PS) 414 coupled with the battery pack 422, and thus to control the charging of the battery pack 422. A system management controller (SMC) 420 is used to interface with the battery pack 422. The SMC 420 operates to control the selector 418. In some embodiments, an intelligent battery safety management system 402 provides for management of the charging of the battery pack 422.

In some embodiments, the battery safety management system 402 communicates with the operating system 416 regarding battery problems that are detected so that users may be notified. In some embodiments, the battery safety management system 402 further communicates with the system platform (including the central processing units (CPUs), chipset, and other elements) regarding the battery operation to receive information, which may include reference data, for allowable battery packs and battery cells. The battery safety management system 402 may further communicate with the platform 406 to allow the platform to take any actions needed to address any battery problems that are detected.

Those skilled in the art having the benefit of this disclosure will appreciate that many other variations from the foregoing description and drawings may be made within the scope of the present invention. Indeed, the invention is not limited to the details described above. Rather, it is the following claims including any amendments thereto that define the scope of the invention.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

The present invention may include various processes. The processes of the present invention may be performed by hardware components or may be embodied in machine-executable instructions, which may be used to cause a general-purpose or special-purpose processor or logic circuits programmed with the instructions to perform the processes. Alternatively, the processes may be performed by a combination of hardware and software.

Portions of the present invention may be provided as a computer program product, which may include a machine-readable medium having stored thereon instructions, which may be used to program a computer (or other electronic devices) to perform a process according to the present invention. The machine-readable medium may include, but is not limited to, floppy diskettes, optical disks, CD-ROMs (compact disk read-only memory), and magneto-optical disks, ROMs (read-only memory), RAMs (random access memory), EPROMs (erasable programmable read-only memory), EEPROMs (electrically-erasable programmable read-only memory), magnet or optical cards, flash memory, or other type of media/machine-readable medium suitable for storing electronic instructions. Moreover, the present invention may also be downloaded as a computer program product, wherein the program may be transferred from a remote computer to a requesting computer by way of data signals embodied in a carrier wave or other propagation medium via a communication link (e.g., a modem or network connection).

Many of the methods are described in their most basic form, but processes can be added to or deleted from any of the methods and information can be added or subtracted from any of the described messages without departing from the basic scope of the present invention. It will be apparent to those skilled in the art that further modifications and adaptations can be made. The particular embodiments are not provided to limit the invention but to illustrate it. The scope of the present invention is not to be determined by the specific examples provided above but only by the claims below.

It should also be appreciated that reference throughout this specification to "one embodiment" or "an embodiment" means that a particular feature may be included in the practice of the invention. Similarly, it should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

What is claimed is:

1. A method for detecting shorts in battery cells in a system comprising:
    powering a mobile computing system with a battery pack, the battery pack being rechargeable, the battery pack including a management unit communicatively coupled to the system and a plurality of battery cell blocks, each cell block including one or more battery cells;
    monitoring, with the management unit, a voltage of each cell block of the plurality;
    logging, with the management unit, the voltage of each cell block of the plurality prior to the system shutting down to generate a set of logged voltage values in response to determining the system is to shut down;
    restarting the system after the shut down and, after restarting the system, measuring a start-up voltage value of each cell block of the plurality;
    determining an amount of self-discharge for each cell block based at least in part on a comparison of the start-up voltage value with the logged voltage value; and
    shutting down operation of the battery pack or sending a warning from the management unit to the system in response to a determination that the amount of self-discharge is indicative of a nascent short circuit in a cell.

2. The method of claim 1, wherein the determination of the nascent short is based on whether any cell block has discharged more quickly than the other cell blocks of the battery pack in a manner inconsistent with cell aging.

3. The method of claim 1, wherein the determination of the nascent short is based on comparing the start-up voltage value of each cell block with a threshold value.

4. The method of claim 3, wherein the threshold value is a low-voltage cut-off level for a battery cell.

5. A mobile computing device comprising:
a rechargeable battery pack to power the device, the battery pack having a plurality of cell blocks, each cell block including one or more battery cells;
a battery charger to provide power to the rechargeable battery pack; and
a battery management unit, the battery management unit to monitor the voltages of the plurality of cell blocks, detect nascent short circuits in the battery cells of the cell blocks based on an amount of cell-block self-discharge, and take a preventative action in response to detecting a nascent short circuit;
wherein monitoring the voltages of the plurality of the cell blocks includes logging the voltage of each of the cell blocks prior to a shutdown of the device, and in response to determining the computing device is to shut down, and comparing the logged voltages to a start-up voltage of each of the cell blocks measured after a restart of the device subsequent to the device shut down; and
wherein detecting a nascent short circuit includes determining the amount of self-discharge for each cell block is inconsistent with cell aging.

6. The device of claim 5, wherein the battery management unit detects a nascent short circuit in one or more of the battery cells of a first cell block if the comparison of voltages indicates that first cell block discharges more quickly that the other cell blocks of the battery pack.

7. The device of claim 6, wherein monitoring the voltages of the plurality of cell blocks further includes comparing the current voltages of the cell blocks to a threshold voltage level.

8. The device of claim 6, wherein the preventive action includes one or more of shutting down the battery pack and sending a warning to the system regarding the short circuit.

9. The device of claim 6, wherein the battery management unit is a part of the battery pack.

10. The device of claim 6, wherein the preventive action includes both sending a warning to the system regarding the short circuit and shutting down the battery pack.

11. A mobile computing device comprising:
a rechargeable battery pack to power the device, the battery pack having a plurality of cell blocks, each cell block including one or more battery cells;
a battery management unit, the battery management unit to monitor the voltages of the plurality of cell blocks, detect nascent short circuits in the battery cells of the cell blocks based on an amount of cell-block self-discharge, and take a preventative action in response to detecting a nascent short circuit;
wherein monitoring the voltages of the plurality of the cell blocks includes logging the voltage of each of the cell blocks prior to a shutdown of the device, and in response to determining the computing device is to shut down, and comparing the logged voltages to a start-up voltage of each of the cell blocks measured after a restart of the device subsequent to the device shut down; and
wherein detecting a nascent short circuit includes determining the amount of self-discharge for each cell block, as determined based on the cell block voltage comparison, is inconsistent with cell aging.

12. The device of claim 11, wherein the battery management unit is to detect the nascent short circuit if the comparison of voltages indicates that a first cell block discharges more quickly that other cell blocks of the battery pack.

13. The device of claim 11, wherein monitoring the voltages of the plurality of cell blocks further includes comparing the start-up voltages of each of the cell blocks to a threshold voltage level.

* * * * *